(12) United States Patent
Motoori

(10) Patent No.: US 10,699,928 B2
(45) Date of Patent: Jun. 30, 2020

(54) TRANSPORT SYSTEM WITH CRANE

(71) Applicant: Murata Machinery, Ltd., Kyoto (JP)

(72) Inventor: Yoichi Motoori, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 16/313,423

(22) PCT Filed: May 2, 2017

(86) PCT No.: PCT/JP2017/017242
§ 371 (c)(1),
(2) Date: Dec. 26, 2018

(87) PCT Pub. No.: WO2018/003287
PCT Pub. Date: Jan. 4, 2018

(65) Prior Publication Data
US 2019/0164795 A1 May 30, 2019

(30) Foreign Application Priority Data

Jun. 27, 2016 (JP) .................................. 2016-126180

(51) Int. Cl.
*H01L 21/677* (2006.01)
*B65G 1/00* (2006.01)
*B65G 1/04* (2006.01)

(52) U.S. Cl.
CPC .......... *H01L 21/67733* (2013.01); *B65G 1/00* (2013.01); *B65G 1/04* (2013.01);
(Continued)

(58) Field of Classification Search
CPC ................... H01L 21/67733; H01L 21/67769
See application file for complete search history.

(56) References Cited

U.S. PATENT DOCUMENTS 9,073,691 B2 * 7/2015 Morimoto ......... H01L 21/67733
2006/0182553 A1 8/2006 Yamamoto et al.
(Continued)

FOREIGN PATENT DOCUMENTS

CN 1891582 A 1/2007
CN 101088905 A 12/2007
(Continued)

OTHER PUBLICATIONS

The First Office Action dated Jan. 20, 2020, of counterpart Chinese Application No. 201780037187.4, along with an English translation.

(Continued)

*Primary Examiner* — Gerald McClain
(74) *Attorney, Agent, or Firm* — DLA Piper LLP (US)

(57) ABSTRACT

A transport system includes an overhead transport vehicle that travels on a first track and is capable of delivering and receiving an article to and from a load port of a processing tool; a storage rack having a plurality of shelves that store the articles arranged in a vertical direction; a crane that travels on a second track parallel with the first track and is capable of delivering and receiving the article to and from the load port and the storage rack, respectively; and a first buffer arranged at a position where the crane that has stopped traveling at a position to deliver or receive the article to or from the load port is able to deliver or receive the article.

18 Claims, 8 Drawing Sheets

(52) U.S. Cl.
CPC .... *H01L 21/6773* (2013.01); *H01L 21/67727* (2013.01); *H01L 21/67751* (2013.01); *H01L 21/67769* (2013.01); *H01L 21/67775* (2013.01); *H01L 21/677* (2013.01)

(56) References Cited

U.S. PATENT DOCUMENTS

| | | |
|---|---|---|
| 2006/0222479 A1 | 10/2006 | Shiwaku et al. |
| 2006/0237525 A1 | 10/2006 | Sone |
| 2007/0032903 A1 | 2/2007 | Tsujimoto |
| 2008/0014061 A1 | 1/2008 | Izumi |
| 2008/0170932 A1 | 7/2008 | Yamamoto |
| 2008/0240892 A1 | 10/2008 | Courtois et al. |
| 2011/0158776 A1 | 6/2011 | Inui |
| 2012/0189411 A1 | 7/2012 | Yoshinaga |
| 2014/0341681 A1* | 11/2014 | Inagaki ............. H01L 21/67733 414/222.13 |
| 2015/0045937 A1 | 2/2015 | Yamamoto |
| 2017/0200626 A1 | 7/2017 | Takai |
| 2019/0006217 A1* | 1/2019 | Motoori ................ B65G 1/00 |

FOREIGN PATENT DOCUMENTS

| | | |
|---|---|---|
| CN | 101998926 A | 3/2011 |
| CN | 102482035 A | 5/2012 |
| JP | 2005-150129 A | 6/2005 |
| JP | 2005150129 A * | 6/2005 |
| JP | 2006-224944 A | 8/2006 |
| JP | 2006-282303 A | 10/2006 |
| JP | 2006-298566 A | 11/2006 |
| JP | 2008-172062 A | 7/2008 |
| JP | 2015-117073 A | 6/2015 |
| WO | 2013/150859 A1 | 10/2013 |
| WO | 2015/194264 A1 | 12/2015 |

OTHER PUBLICATIONS

The Extended European Search Report dated Feb. 4, 2020, of counterpart European Application No. 17819654.9.

* cited by examiner

TRANSPORT SYSTEM WITH CRANE

TECHNICAL FIELD

This disclosure relates to a transport system.

BACKGROUND

Transport systems are used to transport articles accommodating semiconductor wafers or reticles, for example, in a semiconductor device manufacturing factory or the like (see International Publication No. 2013/150859, for example). That transport system includes an overhead transport vehicle that transports articles and a stacker crane that delivers and receives the articles to and from a storage rack. The overhead transport vehicle transports an article to a load port of a processing tool such as a semiconductor manufacturing apparatus, for example. The storage rack is arranged in the vicinity of the processing tool such as a semiconductor manufacturing apparatus and, when an article is already present on the load port, the overhead transport vehicle transports the article to the uppermost shelf of the storage rack, for example. The stacker crane places the article that has been transported onto the uppermost shelf of the storage rack onto another shelf, or transfers articles between the storage rack and the load port, for example.

When the length of time required to deliver and receive an article to and from the load port is long with the transport system as mentioned above, the operation rate of the processing tool is reduced. For example, if the load port is filled with articles waiting to be transported out, the processing tool cannot have a new article transported into the load port, causing the operation rate to decrease. Also, when there is no article on the load port at the time of shifting to the next processing, the processing tool waits until an article has been transported onto the load port, causing the operation rate to decrease.

In view of the above circumstances, it could be helpful to provide a transport system capable of quickly delivering and receiving articles to and from a processing tool.

SUMMARY

I thus provide:

My transport system comprises: an overhead transport vehicle that travels on a first track and is capable of delivering and receiving an article to and from a load port of a processing tool; a storage rack having a plurality of shelves to store the articles arranged in a vertical direction; a crane that travels on a second track parallel with the first track and is capable of delivering and receiving the article to and from the load port and the storage rack, respectively; and a first buffer arranged at a position where the crane that has stopped traveling at a position to deliver or receive the article to or from the load port is able to deliver or receive the article.

The overhead transport vehicle may include a lateral extender that moves the article in horizontal directions, and the first buffer may be arranged at a position where the overhead transport vehicle can deliver or receive the article using the lateral extender. The first buffer may be arranged at a position where the overhead transport vehicle that has stopped traveling at a position to deliver or receive the article to or from the load port is able to deliver or receive the article using the lateral extender. Furthermore, there may be included a second buffer adjacent to the first buffer and that allows the crane to deliver or receive the article. The overhead transport vehicle may include a lateral extender that moves the article in a horizontal direction, and the second buffer may be arranged at a position where the overhead transport vehicle can deliver or receive the article using the lateral extender. The storage rack may be arranged adjacent to the processing tool, and the overhead transport vehicle may be capable of delivering and receiving the article to and from an uppermost shelf among a plurality of shelves of the storage rack. Also, the first track may be installed directly above the load port.

The first buffer is arranged at the position where the crane that has stopped traveling at a position to deliver or receive an article to or from the load port is able to deliver or receive an article. Therefore, the crane is, in a state of having stopped traveling, capable of transferring the article between the first buffer and the load port. Therefore, the transport system is capable of quickly delivering and receiving the article to and from the processing tool.

The overhead transport vehicle includes the lateral extender that moves the article in the horizontal direction. When the first buffer is arranged at a position where the overhead transport vehicle can deliver or receive the article using the lateral extender, the overhead transport vehicle can transfer the article between the first buffer and the load port, and even if, for example, the crane is in use, the overhead transport vehicle can quickly deliver the articles to and from the processing tool. When the first buffer is arranged at the position where the overhead transport vehicle that has stopped traveling at a position to deliver or receive the article to or from the load port is able to deliver or receive the article using the lateral extender, the overhead transport vehicle in a state of having stopped traveling is capable of transferring the article between the first buffer and the load port and, as a result, the article can be delivered to or received from the processing tool quickly. When there is included a second buffer adjacent to the first buffer and that allows the crane to deliver or receive the article, the number of articles to be delivered to or received from the processing tool to be stored can be increased. Since the second buffer is adjacent to the first buffer, the crane can quickly transfer the article between the load port and the second buffer, the article can be delivered to or received from the processing tool quickly. The overhead transport vehicle includes the lateral extender that moves the article in the horizontal direction. When the second buffer is arranged at a position where the overhead transport vehicle can deliver or receive the article using the lateral extender, the overhead transport vehicle can transfer the article between the second buffer and the load port and, even if, for example, the crane is in use, the overhead transport vehicle can quickly deliver the articles to and from the processing tool. When the storage rack is arranged adjacent to the processing tool, and the overhead transport vehicle is capable of delivering and receiving the article to and from the uppermost shelf among the plurality of shelves of the storage rack, the number of articles to be delivered to or received from the processing tool to be stored can be increased. When the first track is installed directly above the load port, the overhead transport vehicle can deliver the article by lifting or lowering the article from directly above the load port and, as a result, the article can be delivered to or received from the processing tool quickly.

Figure 1A:
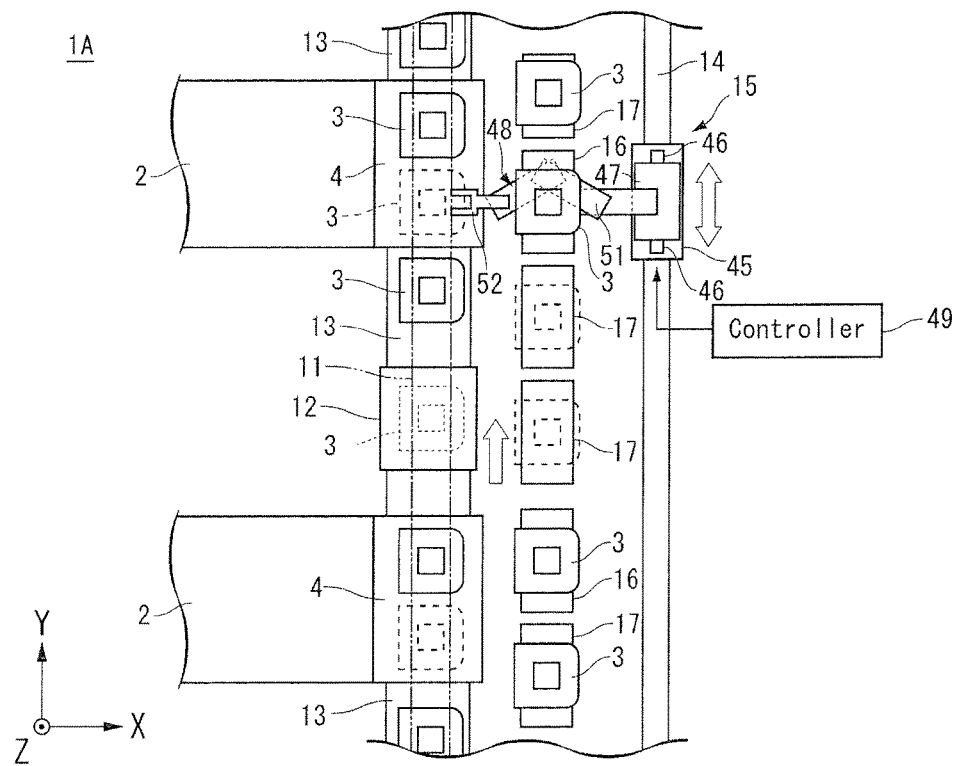
FIGS. 1(A) and 1(B) are diagrams showing a transport system according to a first example.

DESCRIPTION OF REFERENCE SIGNS 1A, 1B, 1C Transport system
2 Processing tool
3 Article
4 Load port
11 First track
12 Overhead transport vehicle
13 Storage rack
14 Second track
15 Crane
16 First buffer
17 Second buffer
18 Ceiling
21 Main body
22 Flange
24 Columnar part
25 Plate-shaped part
26 Travel driver
27 Lift driver
28 Lateral extender
29 Controller
30 Covers
31 Driver
32 Claw
33 Suspenders
34 Support shaft
35 Fixture
36 Upper plate
37 Lower plate
41 Shelf
42 Shelf
43 Floor Surface
45 Traveling carrier
46 Support column
47 Lifter
48 Transferor
49 Controller
50 Guide
51 Multi-joint Arm
52 Holder
55 Support part
56 Placement part

DETAILED DESCRIPTION

The following describes examples with reference to the drawings. In the following drawings, an XYZ coordinate system is used to describe the directions in each drawing. In the XYZ coordinate system, the vertical direction is taken as the Z direction, and the horizontal directions are taken as the X direction and the Y direction. Also, in each of the X, Y, and Z directions, the side pointed by arrow is referred to as the + side (for example, +X side) and the opposite side thereof is referred to as the − side (for example, −Y side) as appropriate.

First Example

Figure 1B:
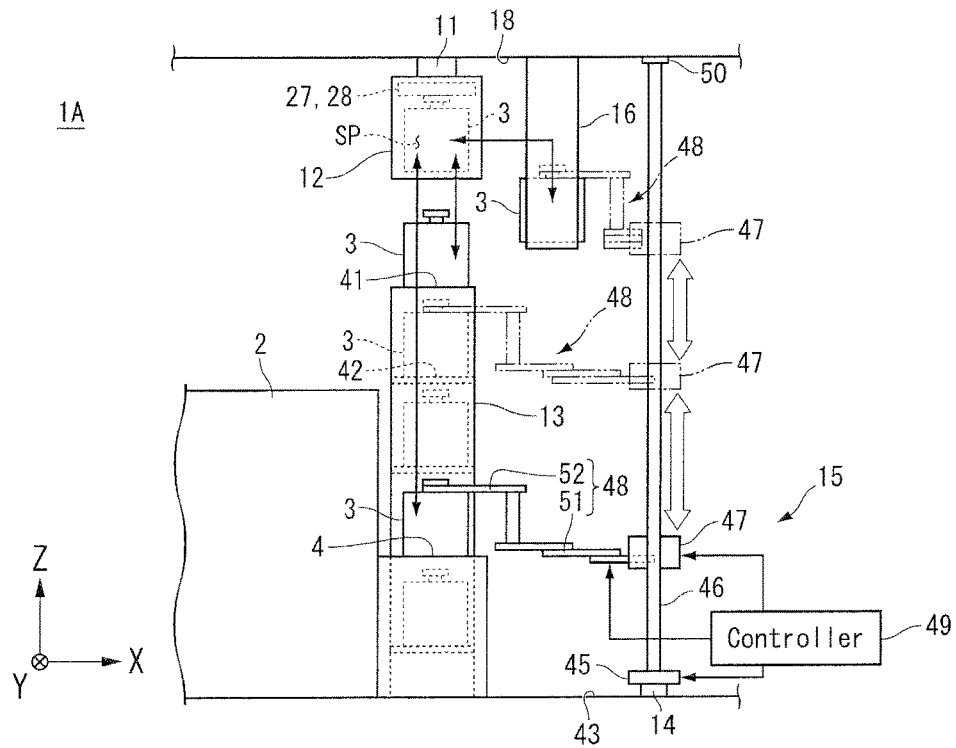

Hereunder, a first example is described. FIGS. 1(A) and 1(B) are diagrams showing a transport system according to the first example. FIG. 1(A) is a top view as seen from the +Z side, and FIG. 1(B) is a side view as seen from the −Y side. A transport system 1A is installed, for example, in a semiconductor device manufacturing factory, and transports articles 3 (shown in FIG. 2) between a processing tool 2 and a stocker for storing articles (not shown in the figure), or between the processing tool 2 and another processing tool. The processing tool 2 is, for example, an exposure apparatus, a coater/developer, a film forming apparatus, or an etching apparatus. For example, a plurality of processing tools 2 are arranged in an inter-bay.

The article 3 is, for example, a container such as a FOUP accommodating semiconductor wafers used to manufacture semiconductor devices and a reticle pod accommodating processing members such as a reticle. The processing tool 2 includes a load port 4 on which the article 3 is placed. The number of articles 3 that can be placed on the load port 4 (refer to the processing tool 2 on the +Y side) is, for example, two, one of which (indicated by solid line) is the article 3 to be transported into the processing tool 2 and the other (indicated by dotted line) of which is the article 3 to be transported out from the processing tool 2. The number of articles 3 that can be placed on the load port 4 may be one or three or more.

The transport system 1A includes a first track 11, an overhead transport vehicle 12, a storage rack 13, a second track 14, a crane 15, a first buffer 16, and a second buffer 17. The first track 11 is installed on a ceiling 18 of a facility (see FIG. 1(B)) such as a cleanroom. The first track 11 is installed, for example, along a direction in which a plurality of processing tools 2 are arranged and extends in the Y direction. The overhead transport vehicle travels on the first track and is capable of delivering and receiving the article 3 to and from the load port 4 of the processing tool 2.

In this example, the first track 11 is installed directly above the load port 4. That is to say, the first track 11 is installed to pass directly above the load port 4. When delivering the article 3 to the load port 4, the overhead transport vehicle 12 stops traveling directly above the load port 4 while holding the article 3 and lowers the article 3 onto the load port 4. Also, when receiving the article 3 from the load port 4, the overhead transport vehicle 12 stops traveling directly above the load port 4, and lifts the article 3 from the load port 4.

Figure 2:
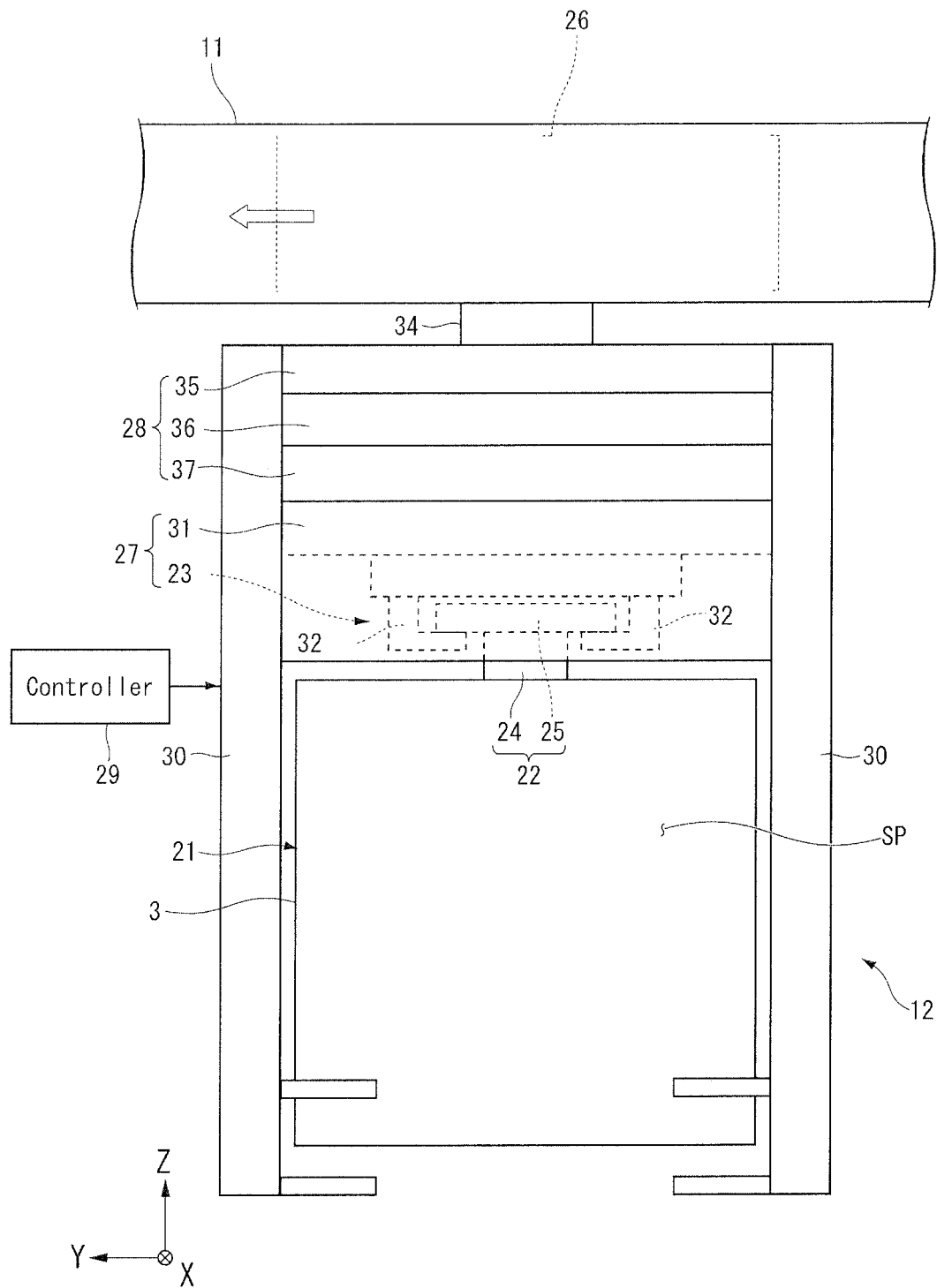
FIG. 2 is a diagram showing an article and an overhead transport vehicle.

FIG. 2 is a diagram showing the article and the overhead transport vehicle. The article 3 includes a main body 21 that accommodates a semiconductor wafer or the like to be transported, and a connector (here, referred to as flange 22) provided above (on the +Z side of) the main body 21 and used to hold the article 3 by the transport system 1A. The overhead transport vehicle 12 holds the article 3 by grasping the flange 22 of the article 3. The flange 22 has a columnar part 24 extending upward (toward the +Z side) from the main body 21 and a plate-shaped part 25 provided on a distal end side of the columnar part 24. The plate-shaped part 25 is, for example, of a rectangular plate shape, but may be of a disk shape. The plate-shaped part 25 projects to the outside of the columnar part 24.

The overhead transport vehicle 12 is called OHT (overhead hoist transport), OHV (overhead hoist vehicle) or the like. The overhead transport vehicle 12 includes a travel driver 26, a lift driver 27, a lateral extender 28, and a controller 29. The lift driver 27 lifts and lowers the article 3 in a vertical direction (the Z direction). The travel driver 26 holds the lift driver 27 and is capable of moving in the horizontal direction along the first track 11. The lateral extender 28 is capable of moving the lift driver 27 in the horizontal direction (in the X direction) with respect to the first track 11. The controller 29 controls each part of the overhead transport vehicle 12.

The overhead transport vehicle 12 travels along the first track 11 by the driving force of the travel driver 26. The overhead transport vehicle 12 includes covers 30 arranged on sides of the article 3. The covers 30 are provided in the traveling directions of the overhead transport vehicle 12 (the −Y side and the +Y side in FIG. 2) with respect to the position where the article 3 is held by the overhead transport vehicle 12. Between the covers 30 there is an accommodation space SP in which the article 3 is held (accommodated) while the overhead transport vehicle 12 is traveling. The travel driver 26 includes an electric motor, a speed reducer, a drive wheel, an encoder and the like. The drive wheel is arranged to be in contact with the first track 11 and connects to an output shaft of the electric motor via the speed reducer. The rotation of the output shaft of the electric motor is transmitted to the drive wheel via the speed reducer, and the overhead transport vehicle 12 travels by rotation of the drive wheel. The encoder detects the rotation speed of the output shaft of the electric motor and outputs the detection result to the controller 29. The controller 29 controls rotation of the electric motor on the basis of the detection result of the encoder and controls the speed or the stop position of the overhead transport vehicle 12. Setting the stop position of the overhead transport vehicle 12 may be performed by identifying an indicator plate or the like that is preliminarily installed along the first track 11.

The lift driver 27 is supported on the travel driver 26 via the lateral extender 28. The lift driver 27 includes a holder 23 that holds the article 3 and a driver 31 that moves the holder 23 in the vertical direction. The holder 23 suspends and holds the article 3 by grasping the flange 22 of the article 3. The holder 23 is, for example, a chuck having a claw 32 movable in the horizontal direction and holds the article 3 by inserting the claw 32 under the plate-shaped part 25 of the flange 22. The holder 23 connects to suspenders 33 (see FIG. 3) such as wires and belts. The driver 31 is, for example, a hoist, and lowers the holder 23 by feeding out the suspenders 33 and lifts the holder 23 by taking up the suspenders 33. The controller 29 controls the lift driver 27 to lower or lift the holder 23 at a predetermined speed. Also, the controller 29 controls the lift driver 27 to maintain the holder 23 at a target height.

The lateral extender 28 is arranged between the covers 30 below the travel driver 26. The lateral extender 28 connects to the travel driver 26 via a support shaft 34. The support shaft 34 extends downward from the travel driver 26, and the travel driver 26 is attached to a lower part of the support shaft 34. The lateral extender 28 includes a fixture 35 and movers (an upper plate 36, a lower plate 37). The fixture 35 is supported on the support shaft 34 and fixed to the travel driver 26. The upper plate 36 is arranged below the fixture 35, and overlaps with the fixture 35 in FIG. 2. Also, the upper plate 36 is movable in the X direction with respect to the fixture 35 along a guide parallel to the X direction (see FIG. 3). The upper plate 36 is moved by the driving force supplied from the driver. The lower plate 37 is arranged below the fixture 36, and overlaps with the upper plate 36 in FIG. 2. Also, the lower plate 37 is movable in the X direction with respect to the upper plate 36 along a guide parallel to the X direction (see FIG. 3). The lower plate 37 is moved by the driving force supplied from the driver.

The lateral extender 28 is such that the driver of the upper plate 36 and the driver of the lower plate 37 are individually provided, for example, and the upper plate 36 and the lower plate 37 are independently movable in the X direction. For example, the lateral extender 28 can move only one of the upper plate 36 and the lower plate 37 in the X direction while both of the upper plate 36 and the lower plate 37 can also be moved in the X direction, and the stroke of the mover (the amount of movement in the X direction) is variable.

In the lateral extender 28, the upper plate 36 and the lower plate 37 may have a common driver or may be movable in parallel in the X direction by a linker or the like. Further, the configuration of the lateral extender 28 described above is an example and can be appropriately changed. For example, the mover may be only the upper plate 36, or three or more members movable in the X direction may be provided. Also, the overhead transport vehicle 12 need not include the lateral extender 28. The overhead transport vehicle 12 may include a rotator (not shown in the figure) that rotates the lift driver 27 about an axis parallel to the Z direction. The rotator adjusts the orientation of the article 3 held by the holder 23 by rotating the lift driver 27.

Figure 3:
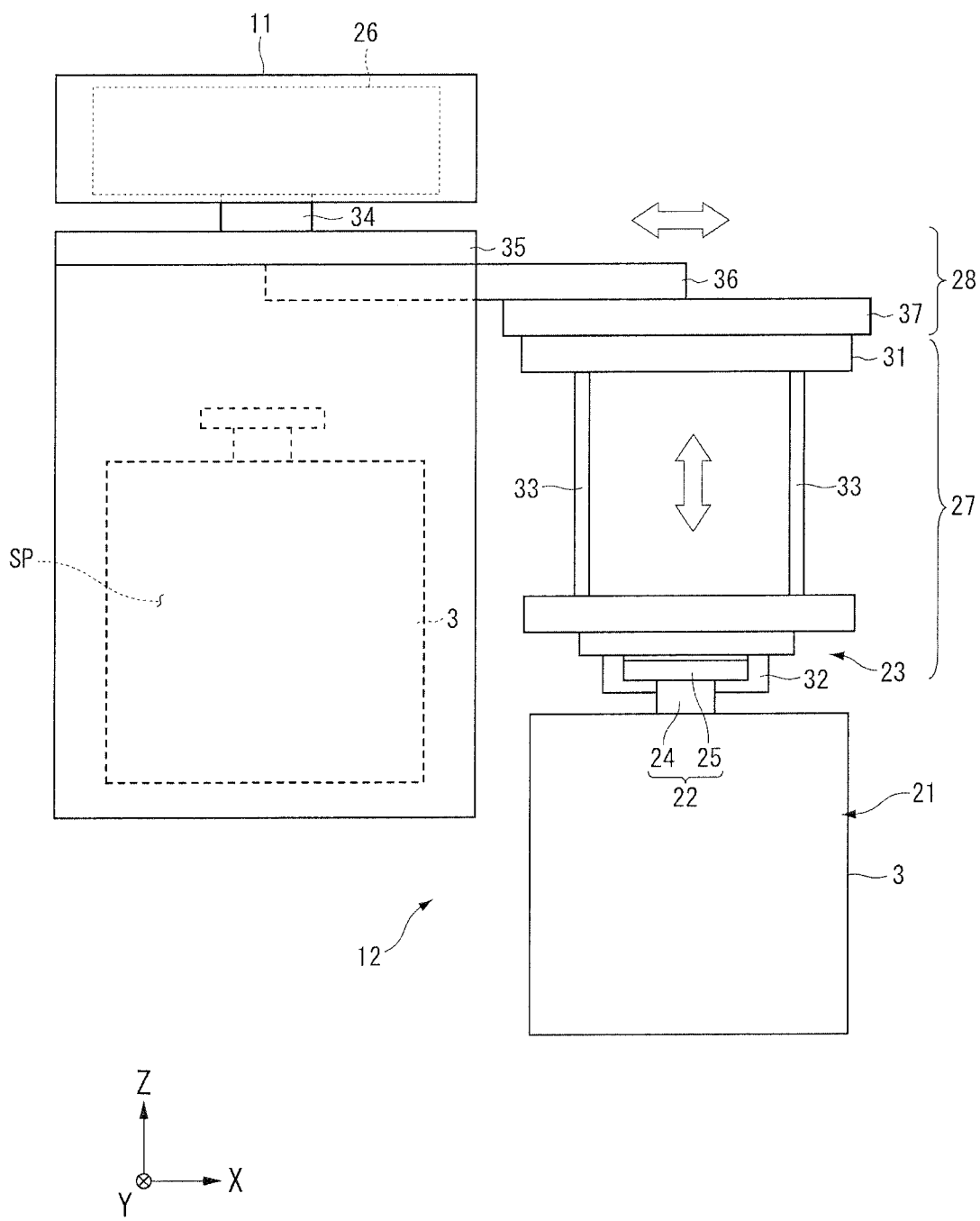
FIG. 3 is an explanatory diagram of a lateral extender of the overhead transport vehicle.

When the overhead transport vehicle 12 delivers the article 3 by the lateral extender 28 as shown in FIG. 3, the driver of the lateral extender 28 moves the upper plate 36 to the +X side with respect to the fixture 35 and the lower plate 37 to the +X side with respect to the upper plate 36, thereby moving the lift driver 27 supported on the lower plate 37 to a target position. The lift driver 27 lowers the holder 23 by feeding out the suspenders 33 downward and places the article 3 at the target position.

When the overhead transport vehicle 12 receives the article 3 by the lateral extender 28, in a state where the lateral extender 28 has moved the lift driver 27 to the +X side, the lift driver 27 feeds out the suspenders 33 downward to lower the holder 23, and the flange 22 of the article 3 is grasped by the holder 23. The lift driver 27 takes up the suspenders 33 to raise the article 3 to a predetermined height. The driver of the lateral extender 28, in a state where the article 3 has been raised to a predetermined height, moves the upper plate 36 to the −X side with respect to the fixture 35 and moves the lower plate 37 to the −X side with respect to the upper plate 36. As a result, the lateral extender 28 moves the lift driver 27 supported on the lower plate 37 to the target position and moves the article 3 held by the holder 23 of the lift driver 27 to the accommodation space SP between the covers 30.

Figure 4:
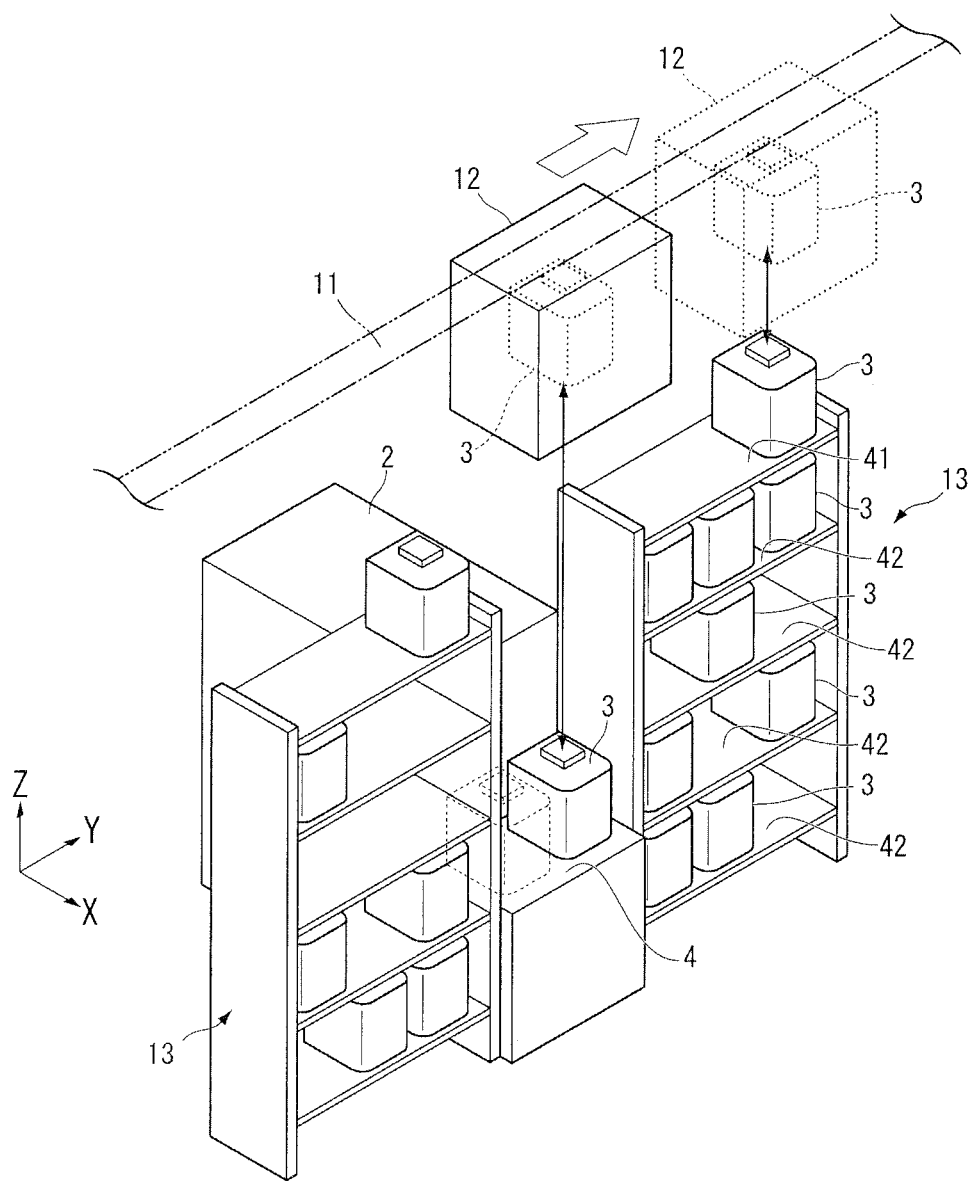
FIG. 4 is a perspective view showing storage racks.

Next, the storage rack 13 will be described with reference to FIGS. 1(A), 1(B) and 4. FIG. 4 is a perspective view showing the storage racks. As shown in FIGS. 1(A) and 1(B), the storage rack 13 is arranged adjacent to the load port 4 while having a gap from the load port 4 or being in contact with the load port 4. The storage rack 13 is installed on at least one of the −Y side and the +Y side with respect to the load port 4 and is arranged, for example, between the load ports 4. In FIG. 4, two storage racks 13 are installed adjacent to the load port 4. However, the number of storage racks 13 may be one or three or more. Also, the storage rack 13 only needs to be installed together with at least one of the plurality of load ports 4, and there may be a load port 4 with which no storage rack 13 is installed together.

The storage rack 13 includes a plurality of shelves (41, 42) (see FIG. 4). The shelves 41, 42 are arranged in the vertical direction (the Z direction). The shelf 41 is the uppermost shelf in the storage rack 13, and the shelf 42 is a shelf below the shelf 41 (the −Z side). The uppermost shelf 41 is a top panel of the storage rack 13 and is opened upward. The uppermost shelf 41 is provided directly below the first track 11, and the overhead transport vehicle 12 can deliver and receive the article 3 to and from the uppermost shelf 41 as with the case of the load port 4 of the processing tool 2. The uppermost shelf 41 can be used as a buffer (for example, UTB; under-track buffer) to temporarily store the article 3 transported by the overhead transport vehicle 12. The number of shelves provided in the storage rack 13 is an arbitrary number of two or more. For example, in FIG. 4, the number of shelves provided in the storage rack 13 is five in total, that is, one uppermost shelf 41 and four shelves 42. However, the total number of shelves may be two, that is, one uppermost shelf 41 and one shelf 42, or the number of shelves 42 may also be two or more.

The storage rack 13 need not use the top panel thereof as the shelf 41 and, in this case, the number of the shelves 42 is two or more. Moreover, the transport system 1A may include a UTB (under-track buffer) above the storage rack 13. In FIG. 4, each of the shelves 41 and 42 is capable of having three articles 3 placed thereon in the Y direction. However, the number of articles 3 that can be placed on one shelf may also be an arbitrary number of two or more.

Next, the second track 14 and the crane 15 will be described, with reference to FIGS. 1(A) and 1(B). At least a part of the second track 14 is installed substantially parallel to the first track 11. For example, in the second track 14, the portion installed along the load port 4 and the storage rack 13 is substantially parallel to the first track 11, but other portions need not be parallel to the first track 11. For example, the second track 14 may be a track-shaped (elliptical) circling track, and the linear part thereof may be substantially parallel to the first track 11. Although the second track 14 is installed on a floor surface 43 in FIG. 1(B), it may be installed on the ceiling 18.

The crane 15 travels on the second track 14 and is capable of delivering and receiving the article 3 to and from the load port 4 and the storage rack 13, respectively. Also, the crane 15 is capable of transporting the article 3 in each of the X direction, the Y direction, and the Z direction. As shown in FIG. 1(B), the crane 15 includes a traveling carrier 45, a support column 46, a lifter 47, a transferor 48, and a controller 49.

The traveling carrier 45 has, for example, a plurality of wheels (not shown in the figure) and moves in the horizontal direction (the Y direction) along the second track 14. The support column 46 is a mast or the like and extends in the vertical direction (the Z direction) from an upper surface of the traveling carrier 45. The support column 46 is fixed to the traveling carrier 45 and is supported on the traveling carrier 45. The support column 46 is also supported on a guide 50 provided on the ceiling 18 and moves in the Y direction together with the traveling carrier 45. The lifter 47 is supported on the support column 46 and is slidable in the Z direction along the support column 46. The transferor 48 (see FIG. 1(A)) includes, for example, a multi-joint arm 51 and a holder 52 provided on a distal end side of the arm 51.

The transferor 48 is capable of moving the holder 52 in the horizontal directions (in the X direction and the Y direction) by bending the arm 51 at joints. The transferor 48 holds the flange 22 (see FIG. 2) of the article 3 by the holder 52. The holder 52 is, for example, of a U shape, and the transferor 48 holds the article 3 by inserting the holder 52 under the plate-shaped part 25 of the flange 22. The transferor 48 raises or lowers the article 3 by the lifter 47 ascending or descending while the article 3 is being held by the holder 52. Also, the transferor 48 moves the article 3 in the X direction within a movable range of the holder 52 by bending the arm 51 at joints while the article 3 is being held by the holder 23. The transferor 48 described above is an example and may have another configuration. The crane 15 moves the article 3 in the Y direction by the traveling carrier 45 traveling in the Y direction while the article 3 is being held by the holder 52. The transferor 48 may employ a configuration in which the article 3 is transported while the bottom surface of the article 3 is being supported, or a configuration in which the article 3 is transported while being grasped from the sides thereof.

The crane 15 is capable of receiving the article 3 from the load port 4 and delivering the article 3 to the shelf 41 or the shelf 42 of the storage rack 13. Also, the crane 15 is capable of receiving the article 3 from the shelf 41 or the shelf 42 of the storage rack 13 and delivering the article 3 to the load port 4. The crane 15 can transfer the article 3 from one shelf of the storage rack 13 (for example, the uppermost shelf 41) to another shelf (for example, the lower shelf 42). The controller 49 controls each part of the crane 15. The controller 49 controls the traveling carrier 45 to cause the traveling carrier 45 to travel or stop. In addition, the controller 49 controls the lifter 47 and the transferor 48 to move the holder 52 to the target position and to thereby cause the holder 52 to grasp the article 3 and/or causes the holder 52 to transfer the article 3 held by the holder 52 to a predetermined position.

Figure 5:
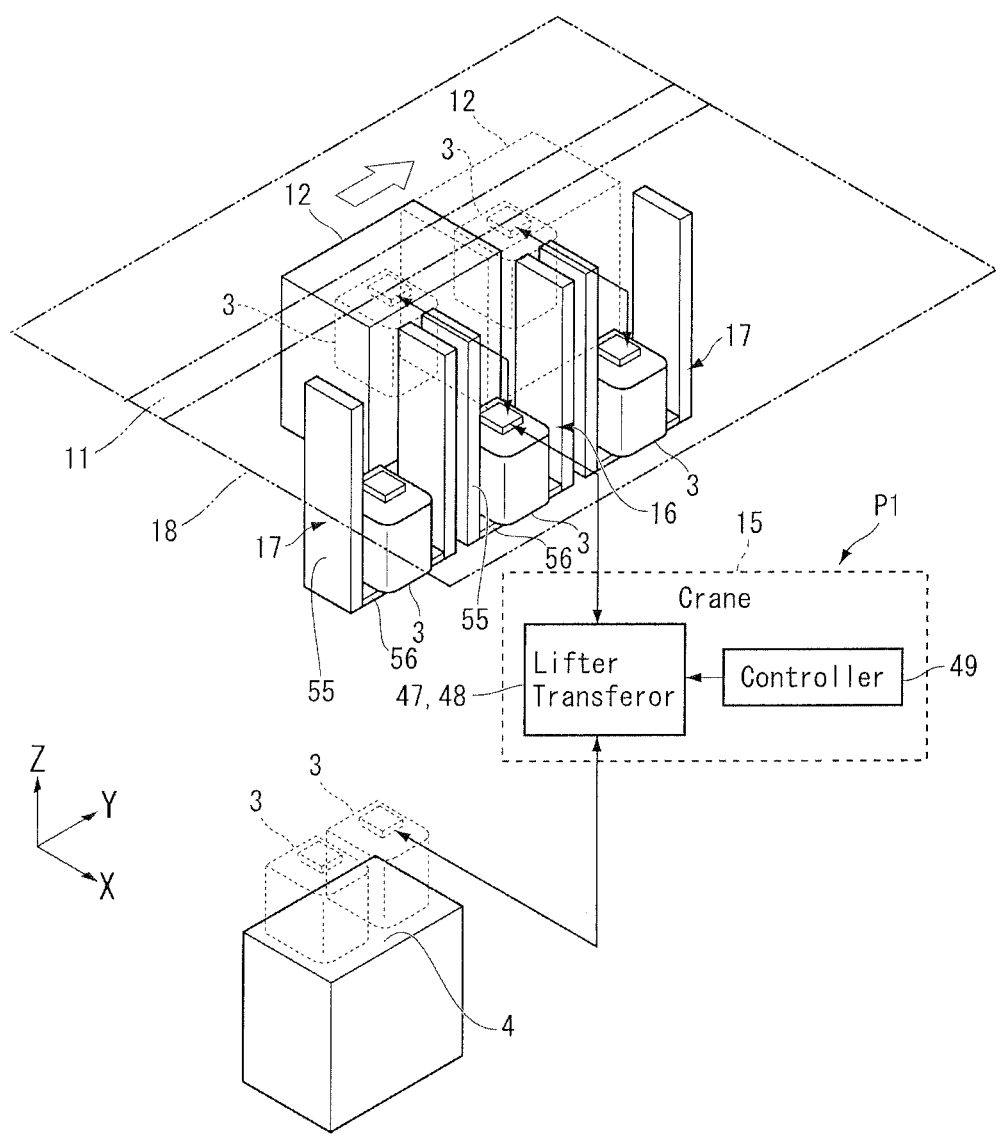
FIG. 5 is a diagram showing a first buffer and a second buffer.

Next, the first buffer 16 and the second buffer 17 will be described, with reference to FIGS. 1(A), 1(B) and 5. FIG. 5 is a conceptual diagram showing the first buffer 16 and the second buffer 17. The first buffer 16 is, for example, an STB (side track buffer), and is provided on a side (+X side) of the first track 11 as shown in FIG. 1(A). The first buffer 16 is used, for example, to temporarily store the article 3 waiting to be transported onto the load port 4 or the article 3 waiting to be transported by the overhead transport vehicle 12. The first buffer 16 is arranged at a position where the overhead transport vehicle 12 can deliver or receive the article 3 by using the lateral extender 28 (see FIG. 3).

As shown in FIG. 5, the first buffer 16 includes a support part 55 and a placement part 56. The support part 55 is fixed to the ceiling 18, for example, and extends downwardly from the ceiling 18. The support part 55 is of a side plate shape, for example, but it may be of another shape such as a columnar shape. The placement part 56 is fixed to a lower end side of the support part 55, and the article 3 is placed on an upper surface of the placement part 56. The placement part 56 is arranged below the position where the overhead transport vehicle 12 holds the article 3 in the accommodation space SP (see FIG. 1(B)). The second buffer 17 has the same configuration as that of the first buffer 16 and is provided adjacent to the first buffer 16. The second buffer 17 is arranged at a position where the crane 15 can deliver or receive the article 3. In addition, the second buffer 17 is arranged at a position where the overhead transport vehicle 12 can deliver or receive the article 3 by using the lateral extender 28. The transport system 1A need not include the second buffer 17.

When the lateral extender 28 (see FIG. 3) delivers the article 3 to the first buffer 16, the overhead transport vehicle 12 moves the lift driver 27 to the +X side by the lateral extender 28 and arranges the lift driver 27 directly above the first buffer 16. In this state, the lift driver 27 lowers the article 3 by feeding out the suspenders 33 downward and places the article 3 on the placement part 56. When the lateral extender 28 (see FIG. 3) receives the article 3 from the first buffer 16, the overhead transport vehicle 12 moves the lift driver 27 to the +X side by the lateral extender 28 and arranges the lift driver 27 directly above the first buffer 16. In this state, the lift driver 27 lowers the holder 23 by feeding out the suspenders 33 downward, and the holder 23 grasps the flange 22 of the article 3. The lift driver 27 takes up the suspenders 33 to raise the article 3 to a predetermined height. When the article 3 has been raised to the predetermined height, the lateral extender 28 moves the lift driver 27 to the −X side to accommodate the article 3 in the accommodation space SP between the covers 30.

Moreover, the overhead transport vehicle 12 is, in the state of having stopped traveling, also capable of transferring the article 3 between the load port 4 and the first buffer 16. The overhead transport vehicle 12 is controlled by the controller 29 and stops traveling directly above the load port 4 and then uses the lateral extender 28 to accommodate the article 3 placed on the first buffer 16 into the accommodation space SP. Then, the overhead transport vehicle 12 is controlled by the control unit 29 to lower the article 3 to directly below the accommodation space SP to place the article 3 on the load port 4. Similarly, after the article 3 has been lifted from the load port 4 to the accommodation space SP, the overhead transport vehicle 12 can place the article 3 on the first buffer 16 using the lateral extender 28.

The first buffer 16 is arranged at the position where the crane 15 that has stopped traveling at a position to deliver or receive the article 3 to or from the load port is able to deliver or receive the article 3. Symbol P1 in FIG. 5 denotes a travel stop position of the crane 15 when the crane 15 delivers or receives the article 3 to or from the load port 4. The first buffer 16 is arranged at a position where the crane 15 that has stopped at the position P1 is able to deliver or receive the article 3. That is to say, in the state of having stopped traveling at the position P1, the crane 15 is capable of performing any one of the following: receiving the article 3 from the load port 4, delivering the article 3 to the load port 4, receiving the article 3 from the first buffer 16, and delivering the article 3 to the first buffer 16.

For example, when the article 3 is placed on the load port 4, the crane 15 transfers the article 3 from the load port 4 to the first buffer 16 in the state of having stopped traveling at the position P1 to create space for which the overhead transport vehicle 12 transports the article 3 to the load port 4. At this time, the controller 49 controls the traveling carrier 45 to cause the traveling carrier 45 to stop traveling at the position P1. Moreover, the controller 49 controls the lifter 47 and the transferor 48 in a state where the traveling carrier 45 has stopped traveling at the position P1, and the controller 49 moves the holder 52 to the position of the article 3 placed on the load port 4 and causes the holder 52 to hold the article 3. The control unit 49 controls the lifter 47 and the transferor 48 to lift and move the article 3 in the horizontal direction and holds the article 3 above the lifter 47. After having raised the article 3 to the height of the first buffer 16 by the lifter 47, the controller 49 controls the lifter 47 and the transferor 48 to place the article 3 on the placement part 56 of the first buffer 16.

For example, when the article 3 is not placed on the load port 4, the crane 15 transfers the article 3 from the first buffer 16 to the load port 4 to supply the article 3 to be processed by the processing tool 2. The controller 49 operates the respective parts of the crane 15 in the reverse order of transferring the article 3 from the load port 4 to the first buffer 16, for example, to thereby transfer the article 3 from the first buffer 16 to the load port 4. In this way, the crane 15 can transfer the article 3 from the load port 4 to the first buffer 16 without the traveling carrier 45 traveling. Therefore, the transport system 1A can eliminate the length of time required for moving the traveling carrier 45 to transfer the article 3 and can quickly deliver and receive the article 3.

Figure 6A:
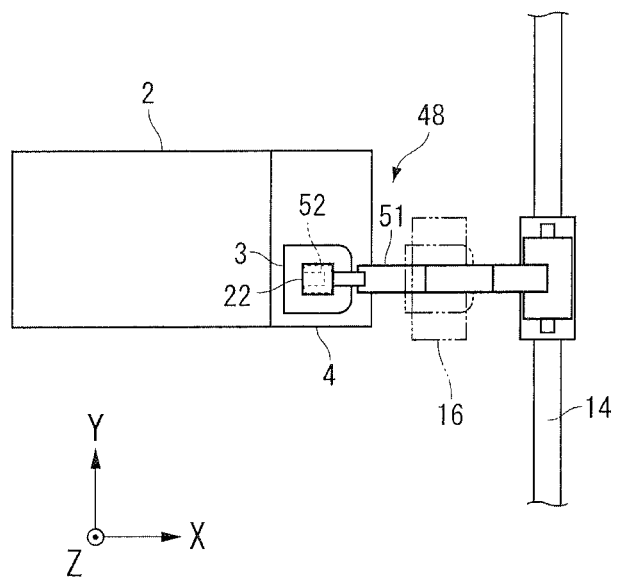
FIGS. 6(A) and 6(B) are diagrams showing an operation of a transferor and a range in which the first buffer is arranged.
Figure 6B:
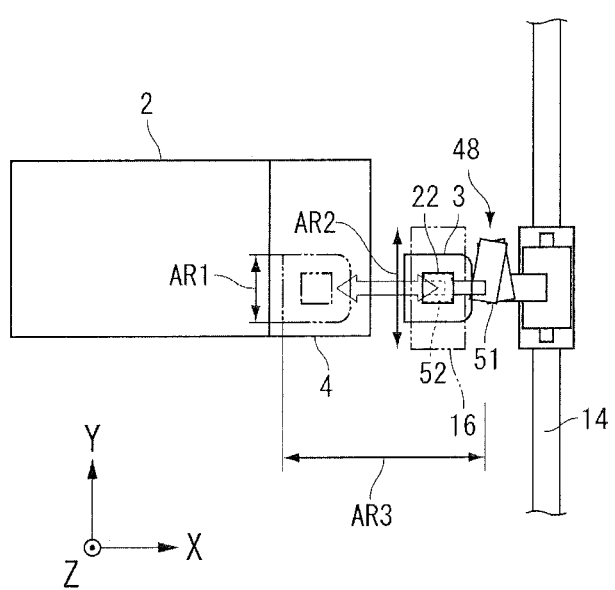

FIGS. 6(A) and 6(B) are diagrams showing an operation of the transferor 48 and a position of the first buffer 16. In the transferor 48, the arm 51 is capable, by being bent by a linker or the like, of moving the holder 52 in the direction perpendicular to the second track 14 (the X direction) and causing the holder 52 to advance or retract with respect to the load port 4. Hereunder, a direction of a straight line that connects the position of the transfer origin and the position of the transfer destination when the transferor 48 transfers the article 3, is referred to as a transfer direction. In FIGS. 6(A) and 6(B), the transfer direction is a direction (the X direction) substantially perpendicular to the second track 14.

FIG. 6(A) shows a state where the arm 51 has extended and the holder 52 has advanced onto the load port 4, and the holder 52 is holding the flange 22 of the article 3 on the load port 4. FIG. 6(B) shows a state where the arm 51 has retracted and the holder 52 has evacuated from the load port 4, and the holder 52 holding the flange 22 of the article 3 on the first buffer 16. In FIG. 6(B), symbol AR1 denotes a range of the article 3 on the load port 4 in a direction (the Y direction) parallel to the second track 14. Symbol AR2 denotes a range in which the article 3 can be placed on the first buffer 16 in the direction (the Y direction) parallel to the second track 14. The position of the first buffer 16 is set so that the range AR1 falls within the range AR2. Further, the first buffer 16 is arranged in a range AR3 in which the transferor 48 can transfer the article 3 in the direction (the X direction).

Second Example

When there are a plurality of placement positions of the article 3 on the load port 4, the first buffer 16 may be provided to correspond to at least one of the plurality of placement positions. For example, as shown in FIGS. 1(A) and 1(B), when there are two placement positions, the first buffer 16 may be able to have two or more of the articles 3 placed thereon so that the article 3 can be transferred from each of the two placement positions. The first buffer 16 may be provided at a position where the article 3 can be transferred from one placement position and at a position where the article 3 can be transferred from the other placement position. Further, the first buffer 16 may be provided at a position where the article 3 can be transferred from the one placement position, and the first buffer 16 need not be provided at a position where the article 3 can be transferred from the other placement position.

Second Example

Figure 7A:
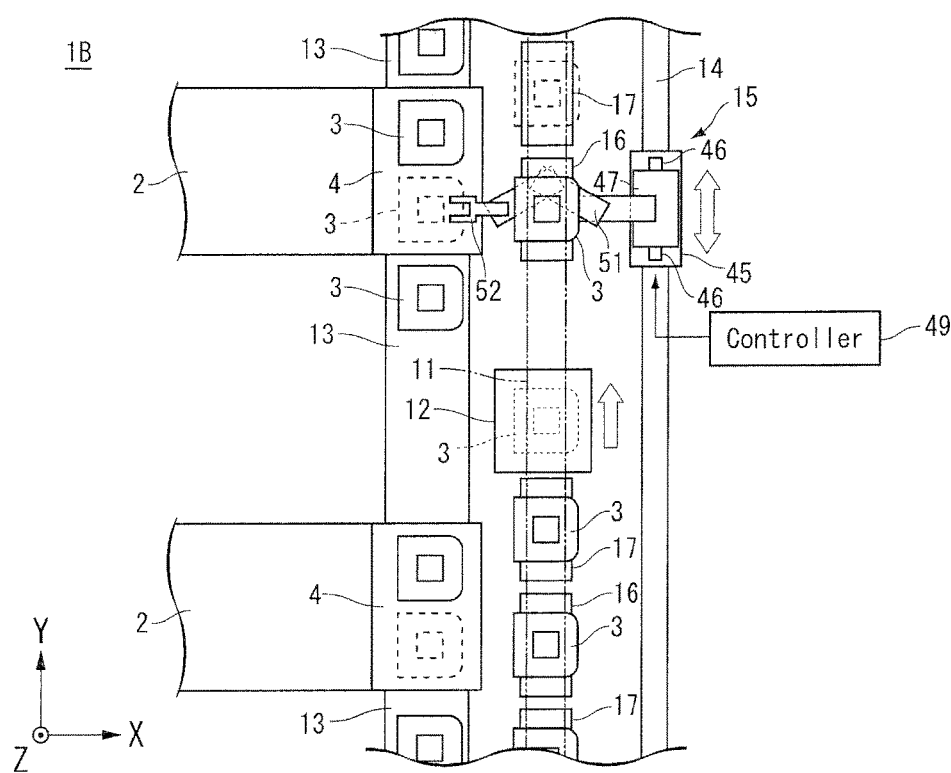
FIGS. 7(A) and 7(B) are diagrams showing a transport system according to a second example.
Figure 7B:
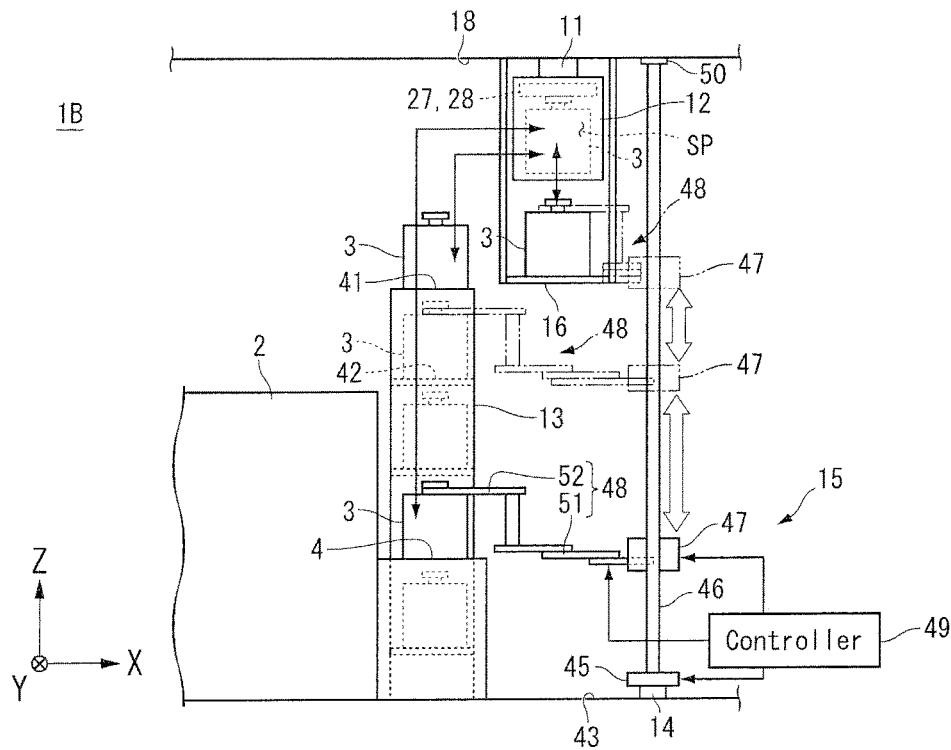

Hereunder, a second example is described. In the second example, similar members as those described above are assigned with the same symbols and the descriptions thereof are omitted or simplified. FIGS. 7(A) and 7(B) are diagrams showing a transport system according to this example. A transport system 1B differs from that of the first example in the positional relationship between a load port 4 of a processing tool 2 and a first track 11 and the positional relationship between a first buffer 16 and the first track 11. The first track 11 is installed at a position deviating from directly above of the load port 4 in the X direction. The first track 11 is arranged on the same side as the second track 14 with respect to the load port 4. The first track 11 is installed to pass directly above the first buffer 16. The first buffer 16 and a second buffer 17 are UTBs (under-track buffers), for example. The first buffer 16 is provided to not hinder the travel of an overhead transport vehicle 12 on the first track 11. As shown in FIG. 7(B), the first buffer 16 is attached to a ceiling 18 at a portion on the outer side in the X direction with respect to the overhead transport vehicle 12. However, the first buffer 16 may be provided on a frame or the like supported on a floor surface 43.

When delivering or receiving the article 3 to and from the first buffer 16, the overhead transport vehicle 12 stops traveling directly above the first buffer 16 and raises or lowers the article 3 to or from directly below the accommodation space SP. In this example, a lateral extender 28 of the overhead transport vehicle 12 is capable of moving a lift driver 27 (see FIG. 3) to the −X side. When delivering or receiving the article 3 to and from the load port 4, the overhead transport vehicle 12 stops traveling directly above the first buffer 16 and moves the lift driver 27 to directly above the load port 4 to raise or lower the article 3. The overhead transport vehicle 12 can, in a state of having stopped traveling directly above the first buffer, deliver or receive the article 3 to or from the first buffer 16 and deliver or receive the article to or from the load port 4. Thereby, the overhead transport vehicle 12 is, in the state of having stopped traveling, capable of transferring the article 3 between the load port 4 and the first buffer 16. The transport system 1B may include an STB that allows the overhead transport vehicle 12 to deliver and receive the article 3 using the lateral extender 28.

Third Example

Figure 8A:
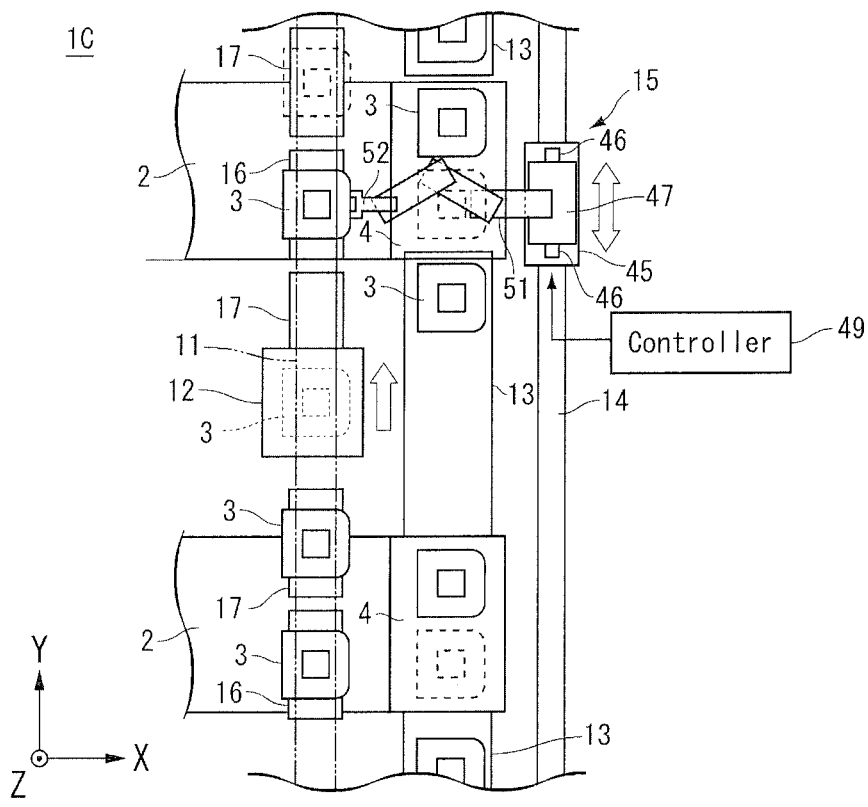
FIGS. 8(A) and 8(B) are diagrams showing a transport system according to a third example.
Figure 8B:
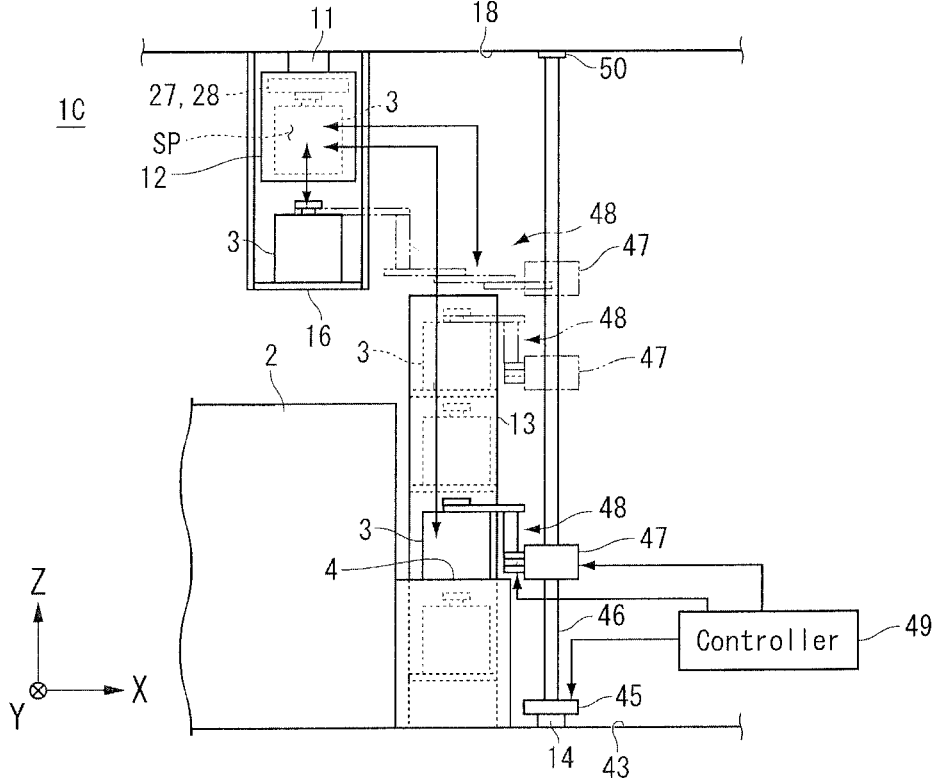

Hereunder, a third example is described. In the third example, similar members as those described above are assigned with the same symbols and the descriptions thereof are omitted or simplified. FIGS. 8(A) and 8(B) are diagrams showing a transport system according to this example. A transport system 1C differs from those of the first and second examples in the positional relationship between a load port 4 of a processing tool 2 and a first track 11, and the positional relationship between a first buffer 16 and a crane 15. The first track 11 is installed at a position deviating from directly above of the load port 4 in the X direction. The first track 11 is arranged on the opposite side of the second track 14 with respect to the load port 4. The first track 11 is installed above the processing tool 2 so that the overhead transport vehicle 12 on the first track 11 can deliver to or receive from the load port 4 by the lateral extender 28. The first buffer 16 is a UTB (an under-track buffer), for example, and is arranged directly below the first track 11. Since such transport system 1C uses a space above the processing tool 2, space saving can be achieved in the X direction. The transport system 1C may include an STB that allows the overhead transport vehicle 12 to deliver and receive the article 3 using the lateral extender 28.

The technical scope of this disclosure is not limited to the mode described in the above examples. One or more of the requirements described in the above examples may be omitted in some cases. One or more of the requirements described in the above examples may be appropriately combined. In addition, the contents of Japanese Patent Application No. 2016-126180 and all documents cited in the detailed description are incorporated herein by reference to the extent permitted by law.

The invention claimed is:

1. A transport system comprising:
   an overhead transport vehicle that 1) travels on a first track and 2) delivers and receives an article directly to and from a load port of a processing tool;
   a storage rack having a plurality of shelves that store the articles arranged in a vertical direction;
   a crane that 1) travels on a second track parallel with the first track and 2) delivers and receives the article directly to and from the load port and the storage rack, respectively; and
   a first buffer arranged at a position where the crane that has stopped traveling at a position to deliver or receive the article directly to or from the load port is able to deliver or receive the article, wherein
   the crane moves the article horizontally to one lateral side of the second track by a first distance and transfers the article to the load port,
   the crane moves the article horizontally to the one lateral side of the second track by a second distance different from the first distance and transfers the article to the first buffer, and
   the overhead transport vehicle delivers or receives the article to and from the first buffer.

2. The transport system according to claim 1, wherein the overhead transport vehicle includes a lateral extender that moves the article in horizontal directions, and
   the first buffer is arranged at a position where the overhead transport vehicle is able to deliver or receive the article using the lateral extender.

3. The transport system according to claim 2, wherein the first buffer is arranged at a position where the overhead transport vehicle that has stopped traveling at a position to deliver or receive the article to or from the load port is able to deliver or receive the article using the lateral extender.

4. The transport system according to claim 3, further comprising a second buffer adjacent to the first buffer that allows the crane to deliver or receive the article.

5. The transport system according to claim 3, wherein
   the storage rack is arranged adjacent to the processing tool, and
   the overhead transport vehicle is capable of delivering and receiving the article to and from an uppermost shelf of a plurality of shelves of the storage rack.

6. The transport system according to claim 3, wherein the first track is installed directly above the load port.

7. The transport system according to claim 2, further comprising a second buffer adjacent to the first buffer that allows the crane to deliver or receive the article.

8. The transport system according to claim 2, wherein
   the storage rack is arranged adjacent to the processing tool, and
   the overhead transport vehicle is capable of delivering and receiving the article to and from an uppermost shelf of a plurality of shelves of the storage rack.

9. The transport system according to claim 3, wherein the first track is installed directly above the load port.

10. The transport system according to claim 1, further comprising a second buffer adjacent to the first buffer that allows the crane to deliver or receive the article.

11. The transport system according to claim 10, wherein the overhead transport vehicle includes a lateral extender that moves the article in the horizontal directions, and the second buffer is arranged at a position where the overhead transport vehicle is able to deliver or receive the article using the lateral extender.

12. The transport system according to claim 11, wherein the storage rack is arranged adjacent to the processing tool, and
the overhead transport vehicle is capable of delivering and receiving the article to and from an uppermost shelf of a plurality of shelves of the storage rack.

13. The transport system according to claim 11, wherein the first track is installed directly above the load port.

14. The transport system according to claim 10, wherein the storage rack is arranged adjacent to the processing tool, and
the overhead transport vehicle is capable of delivering and receiving the article to and from an uppermost shelf of a plurality of shelves of the storage rack.

15. The transport system according to claim 10, wherein the first track is installed directly above the load port.

16. The transport system according to claim 1, wherein the storage rack is arranged adjacent to the processing tool, and
the overhead transport vehicle is capable of delivering and receiving the article to and from an uppermost shelf of a plurality of shelves of the storage rack.

17. The transport system according to claim 16, wherein the first track is installed directly above the load port.

18. The transport system according to claim 1, wherein the first track is installed directly above the load port.

\* \* \* \* \*